(12) United States Patent
Hsu et al.

(10) Patent No.: US 7,078,320 B2
(45) Date of Patent: Jul. 18, 2006

(54) PARTIAL WAFER BONDING AND DICING

(75) Inventors: Louis C. Hsu, Fishkill, NY (US);
Hsichang Liu, Fishkill, NY (US);
James R. Salimeno, III, Fairfax, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/710,880

(22) Filed: Aug. 10, 2004

(65) Prior Publication Data

US 2006/0035443 A1   Feb. 16, 2006

(51) Int. Cl.
*H01L 21/326*   (2006.01)
*H01L 21/46*   (2006.01)

(52) U.S. Cl. .................. 438/464; 438/458; 438/459; 438/421; 438/977; 438/456; 257/E21.606

(58) Field of Classification Search ............... 438/464, 438/458, 456, 459, 977, 421; 257/E21.606
See application file for complete search history.

(56) References Cited

U.S. PATENT DOCUMENTS

| | | | |
|---|---|---|---|
| 4,962,879 A | | 10/1990 | Goesele et al. |
| 5,091,331 A | * | 2/1992 | Delgado et al. ............ 438/458 |
| 5,654,226 A | * | 8/1997 | Temple et al. ............. 438/458 |
| 5,668,033 A | * | 9/1997 | Ohara et al. ................ 438/113 |
| 6,004,866 A | | 12/1999 | Nakano et al. |
| 6,010,591 A | | 1/2000 | Gosele |
| 6,013,534 A | | 1/2000 | Mountain |
| 6,538,330 B1 | | 3/2003 | Forbes |
| 6,555,901 B1 | * | 4/2003 | Yoshihara et al. .......... 257/684 |
| 6,616,854 B1 | | 9/2003 | Jones et al. |

FOREIGN PATENT DOCUMENTS

WO    WO9925019    5/1999

OTHER PUBLICATIONS

K. Gann, "High Density Packaging of Flash Memory", IEEE, 1998, pp. 96-98.
V. Dragoi et al., "Reversible Wafer Bonding For Reliable Compound Semiconductor Processing", IEEE, 2002, pp. 331-334.
G. Reed, "Semiconductor Packaging", Semiconductor International, Sep., 2003, pp. 50.

* cited by examiner

Primary Examiner—B. William Baumeister
Assistant Examiner—Igwe U. Anya
(74) Attorney, Agent, or Firm—Gibb I.P. Law Firm, LLC; James J. Cioffi, Esq.

(57) ABSTRACT

Disclosed is a method of manufacturing integrated circuit chips that partially joins an integrated circuit wafer to a supporting wafer at a limited number of joining points. Once joined, the integrated circuit wafer is chemically-mechanically polished to reduce the thickness of the integrated circuit wafer. Then, after reducing the thickness of the integrated circuit wafer, the invention performs conventional processing on the integrated circuit wafer to form devices and wiring in the integrated circuit wafer. Next, the invention cuts through the integrated circuit wafer and the supporting wafer to form chip sections. During this cutting process, the integrated circuit wafer separates from the supporting wafer in chip sections where the integrated circuit wafer is not joined to the supporting wafer by the joining points. Chip sections where the integrated circuit wafer remains joined to the supporting wafer are thicker than the chips sections where the integrated circuit wafer separates from the supporting wafer.

26 Claims, 7 Drawing Sheets

PARTIAL WAFER BONDING AND DICING

BACKGROUND OF INVENTION

1. Field of the Invention

The invention presents a method of manufacturing integrated circuit chips that partiallyjoins an integrated circuit wafer to a supporting wafer at a limited number of joining points.

2. Description of the Related Art

Within this application several publications are referenced by arabic numerals within parentheses. Full citations for these, and other, publications may be found at the end of the specification immediately preceding the claims. The disclosures of all these publications in their entireties are hereby expressly incorporated by reference into the present application for the purposes of indicating the background of the present invention and illustrating the state of the art. The below-referenced U.S. Patents disclose embodiments that were satisfactory for the purposes for which they were intended. The disclosures of the below-referenced prior U.S. Patents, in their entireties, are hereby expressly incorporated by reference into the present invention for purposes including, but not limited to, indicating the background of the present invention and illustrating the state of the art.

In 1965, Dr. Gordon Moore, then Director of Research and Development for Fairchild Semiconductor, made the observation that the number of transistor devices per integrated circuit had been doubling every couple of years since the creation of the first integrated circuits in the late 1950's and that he expected the trend to continue for the foreseeable future. This observation was dubbed "Moore's Law" by the trade press. Now almost 40 years later, despite numerous dire predictions of fundamental obstacles, unrelenting industry efforts towards every-increasing semiconductor density have effectively affirmed Dr. Moore's prophetic observation, and the trend is still expected to continue unabated for the foreseeable future. The process of reducing semiconductor device size to increase integrated circuit density is generally referred to as "scaling".

In fact, because of the scaling, silicon based process technologies have facilitated a tremendous increase in the frequency range of operation for both digital and analog circuits. The fast transistors combined with low defect densities open the door to integration of complex high-speed micro-electronic systems on a single chip, which was simply not feasible or economical before. Unfortunately, such ultra-high-frequency integrated systems mandate a paradigm shift in the packaging methodology and thermal managements. Conventional chip/module cooling schemes can no longer handle the thermal dissipation of this new generation of chips. A new cooling concept to effectively remove heat from the chip and module is urgently needed.

There are many motivations for thinning a die. The primary motivation is to improve the thermal conductivity. As wafer thickness is increased, thermal dissipation from the back side of the wafer presents a challenge. The situation is aggravated when a buried oxide layer is presented on a SOI (Silicon on Insulator) wafer which is used to enhance device performance.

On the other hand, in order to enable ultra high density 3-Dimensional stacked packaging of flash memory and SRAM IC for portable electronics, thin dies are necessary to save space. To thin down a die, especially after a wafer's C4 solder balls or wire-bond pads are formed, wafer tested, diced, and picked is definitely not an easy task. In the past, a special set up to polish down the back side of the die with the front size fully protected is one of the conventional approaches. This method is not only expensive, but also results in potential reliability concerns, and is therefore not manufacturable.

One example of temporary bonding, called reversible bonding was proposed by et al. and titled "Reversible Wafer Bonding for Reliable Compound Processing". They suggested the use of wax or dry film adhesives to bond a wafer to a silicon carrier to enhance the mechanical strength during processing. The two substrates are separated after the processing is completed. Similar methods are used in U.S. Pat. No. 4,962,879 and U.S. Pat. No. 6,010,591 (incorporated herein by reference), both are methods to bond two wafers during transportation, handling and processing. They are separated after processing. Unfortunately, all the conventional reversible bonding methods are not suitable for high-temperature processing. During semiconductor processing, especially during steps such as diffusion, oxidation and annealing, the wafer substrate must endure temperature as high as 1100° C. All the reversible bonding methods so far can only sustain a temperature limit of 150° C. Neither method is cost-effective or reliable. Both etching and mechanical polishing are time consuming. The chemicals used for etching and polishing are prone to attack circuits and C4 balls on the front side of the die. A good protective coating and secure holding to avoid damage is a challenge. Besides, neither method is able precisely stop at a predetermined thickness during the thinning process.

SUMMARY OF INVENTION

The invention presents a method of manufacturing integrated circuit chips that partiallyjoins an integrated circuit wafer to a supporting wafer at a limited number of joining points. Once joined, the integrated circuit wafer is chemically-mechanically polished to reduce the thickness of the integrated circuit wafer. Then, after reducing the thickness of the integrated circuit wafer, the invention performs conventional processing on the integrated circuit wafer to form devices and wiring in and on the integrated circuit wafer. Next, the invention cuts through the integrated circuit wafer and the supporting wafer to form chip sections. During this cutting process, the integrated circuit wafer separates from the supporting wafer in chip sections where the integrated circuit wafer is not joined to the supporting wafer by the joining points. Chip sections where the integrated circuit wafer remains joined to the supporting wafer are thicker than the chips sections where the integrated circuit wafer separates from the supporting wafer.

The invention aligns the integrated circuit wafer to the supporting wafer before joining the two. Also, before joining the integrated circuit wafer to the supporting wafer, the invention roughens portions of the integrated circuit wafer facing the supporting wafer to create rough surface portions on the integrated circuit wafer. This roughening process avoids producing rough surface portions adjacent the joining points.

The joining process comprises a bonding process, such as a thermal oxide bonding process. This creates high-temperature joining points that can survive processing temperatures that are reached during the processing that forms the devices and the wiring in the integrated circuit wafer.

These, and other, aspects and objects of the present invention will be better appreciated and understood when considered in conjunction with the following description and the accompanying drawings. It should be understood, however, that the following description, while indicating preferred embodiments of the present invention and numerous specific details thereof, is given by way of illustration and not of limitation. Many changes and modifications may be made within the scope of the present invention without departing from the spirit thereof, and the invention includes all such modifications.

BRIEF DESCRIPTION OF DRAWINGS

The invention will be better understood from the following detailed description with reference to the drawings, in which.

DETAILED DESCRIPTION

Figure 1:
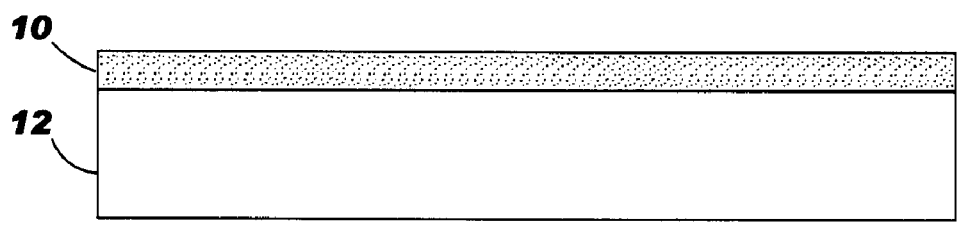
FIG. 1 is a schematic diagram of a partially completed supporting wafer according to the invention.

The present invention and the various features and advantageous details thereof are explained more fully with reference to the nonlimiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the present invention. The examples used herein are intended merely to facilitate an understanding of ways in which the invention may be practiced and to further enable those of skill in the art to practice the invention. Accordingly, the examples should not be construed as limiting the scope of the invention.

As discussed above, one motivation of wafer thinning is to improve the thermal conductivity. Also, in order to enable ultra high density 3-Dimensional stacked packaging of flash memory and SRAM IC for portable electronics, thin dies are necessary to save space. Another reason for thinning wafers is to prepare a failing module for a) analytical optical measurement (with IR, InfraRed) of the front-side circuit operation through the backside (e.g., PICA, Emission Microscopy); b) preparation for backside Focused Ion Beam (FIB) circuit editing during design debug; or c) removal of the majority of the silicon for later wet etching to reveal gate oxide defects. In all of these cases, the endpoint is primarily mechanical from the polishing apparatus. With conventional techniques, the technician's skill is a critical asset here, one needs to have a good "feel" for how various parts polish. There are ways to take a part off the polishing machine and measure optically, but this is tedious at best and destructive of samples due to repeated mounting and dismounting in the worst case. The conventional throughput is pretty poor for a manufacturing process, about 1–3 hours per module, but is perfectly acceptable for Failure Analysis.

Dry (and wet) etching were considered as potential solutions to the problems shown above. Unfortunately, an optical finish is required to see through the chip with little distortion, and all etched surfaces have not been smooth enough for this purpose. While the surface could be polished, for Failure Analysis application with the conventional processing: 1) the etch is not significantly faster, 2) the protective coating application adds setup time, 3) the protective coating needs to be removed for polishing, 4) establishing planarity between the sample and the polishing platen requires actual polishing, observation, and mechanical measurement of the progress and the mechanical measurements cannot be carried out below about 200 microns, 5) the polishing tool (manual) costs less than the etching tool, and 6) etching requires more floor space and environmental protection support equipment.

In order to address these concerns, the invention thins the die by using a "partial wafer bonding" technique. With this technique, bonding applies only to wafer edges and/or some selected chip areas. In other words, partial bonding only bonds the areas where no thinning is required. These areas include test sites, end-point sites, the dummy fillers, etc. The concept can be extended to use such partial bonding techniques to create a mixture of thin and thick dies after dicing. FIGS. 1–7 illustrate different ways of forming the support wafer, and FIGS. 8–12 illustrate how the invention bonds and separates the integrated circuit wafer to and from the support wafer.

Figure 2:
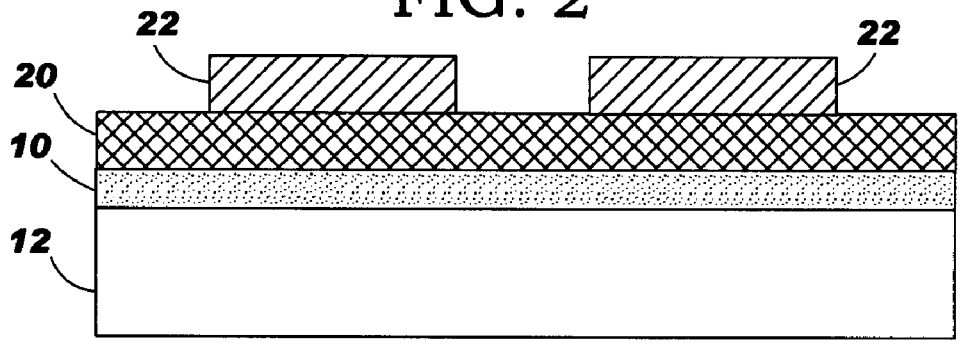
FIG. 2 is a schematic diagram of a partially completed supporting wafer according to the invention.
Figure 3:
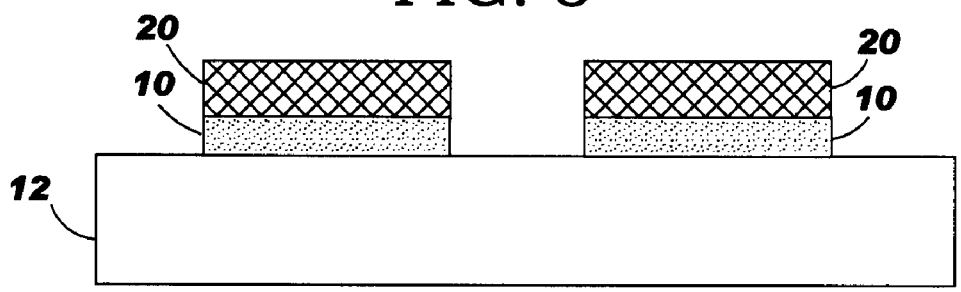
FIG. 3 is a schematic diagram of a partially completed supporting wafer according to the invention.
Figure 4:
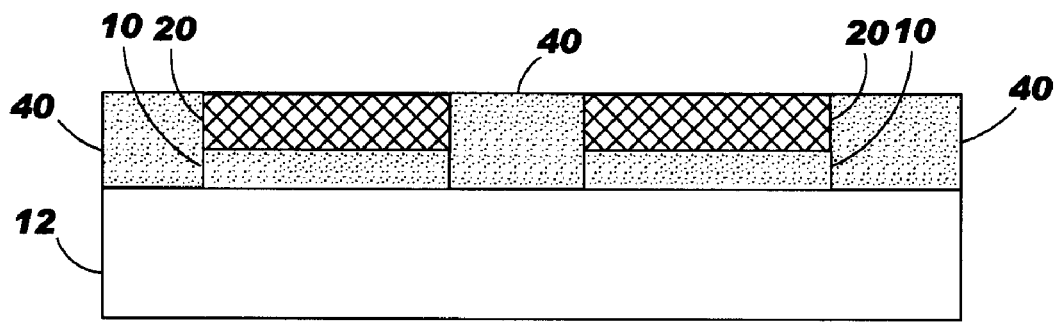
FIG. 4 is a schematic diagram of a partially completed supporting wafer according to the invention.

More specifically, FIG. 1 illustrates a substrate 12 (such as a silicon substrate) with an overlying oxide layer 10 formed using any conventional oxidation technique. In FIG. 2, a nitride layer 20 is deposited over the oxide layer 10 and a mask 22 (such as any conventional photoresist mask) is patterned over the nitride 20. Next, as shown in FIG. 3, the nitride 20 and oxide 10 are patterned through the mask 22 using single, or multiple etching processes (or other similar material removal processes) and the mask 22 is similarly removed. Then, in FIG. 4, additional oxide 40 is formed/grown to produce a support wafer that has an upper surface of nitride regions 20 and oxide regions 40. The structure shown in FIG. 4 can then be used in the subsequent processing shown in FIGS. 8–14.

Figure 5:
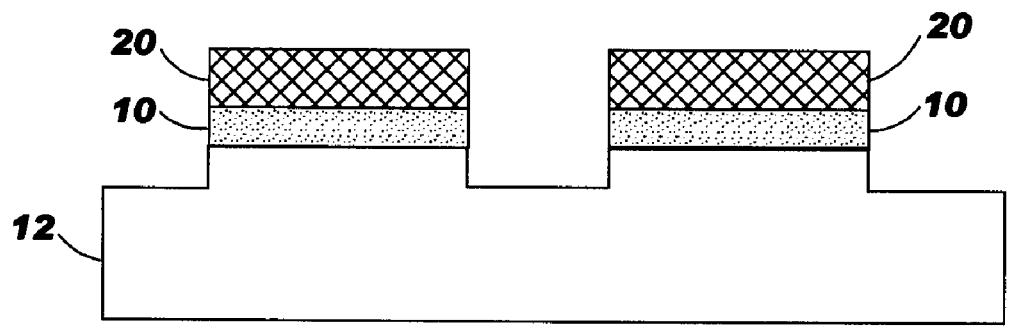
FIG. 5 is a schematic diagram of a partially completed supporting wafer according to the invention.
Figure 6:
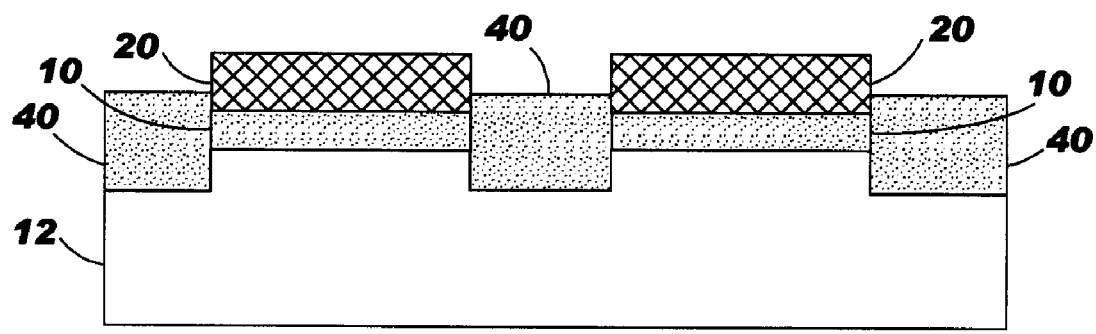
FIG. 6 is a schematic diagram of a partially completed supporting wafer according to the invention.
Figure 7:
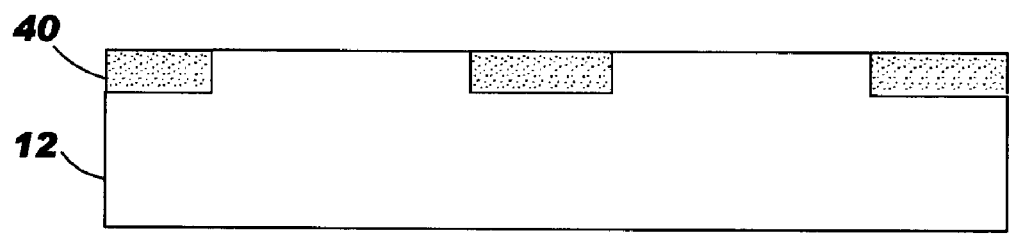
FIG. 7 is a schematic diagram of a partially completed supporting wafer according to the invention.

FIGS. 5–7 illustrate a different method for forming the support wafer. Rather than stopping the etching process on the substrate 12 as shown in FIG. 3, in this embodiment, the etching processes continues to etch a portion of the substrate away, as shown FIG. 5. Before or after this, the mask 22 (shown in FIG. 2) can be removed. Then, the additional oxide 40 is formed as shown in FIG. 6. Next, the structure is planarized, as shown FIG. 7, such that it includes regions of oxide 40 along the smooth upper surface of silicon substrate 12.

As shown in FIGS. 8–12 the invention presents a method of manufacturing integrated circuit chips that partially joins an integrated circuit wafer 84 to a supporting wafer 80 at a limited number of joining points 88. Two similarly sized wafers 80, 84 with similar or different thickness are used for bonding. In this example, the top wafer 84 can be a good quality wafer having a much thinner thickness (½ the thickness or less) than the bottom holding wafer 80.

Figure 8:
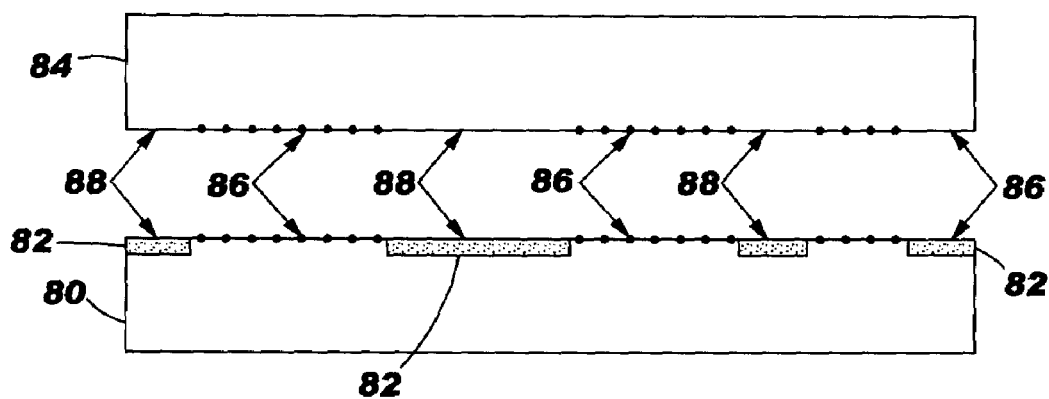
FIG. 8 is a schematic diagram of an integrated circuit wafer and supporting wafer according to the invention.
Figure 9:
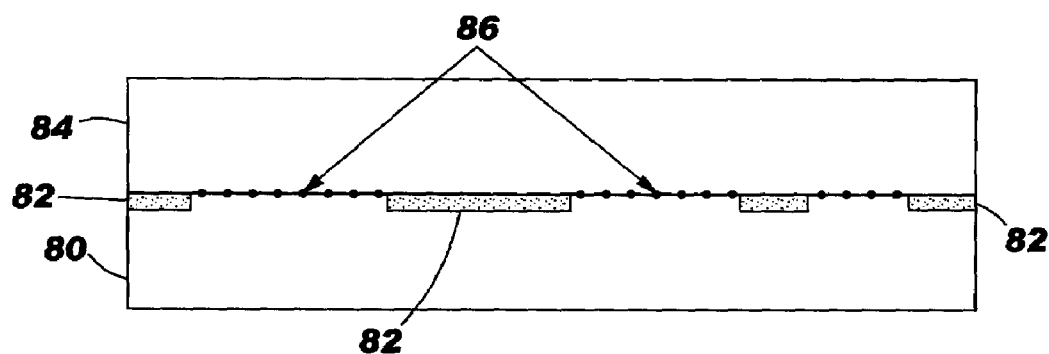
FIG. 9 is a schematic diagram of an integrated circuit wafer and supporting wafer according to the invention.

The joining process is represented by the double arrow in FIG. 8, which results in the structure shown FIG. 9, and comprises a bonding process, such as a thermal oxide bonding process. This joins the two wafers 80, 84 only at the high-temperature joining points 88 (shown only in FIG. 8 for clarity). These joining points 88 can survive processing temperatures of 850–1200° C. that are reached during the processing that forms the devices and the wiring 110 (shown in FIG. 11) in the integrated circuit wafer 84. The bonding agent, such as a grown thermal oxide layer 82 is patterned on the support wafer on specific areas where bonding is desirable using, for example, the processing shown in FIGS. 1–7.

The invention aligns the integrated circuit wafer 84 to the supporting wafer 80 before joining the two. Also, before joining the integrated circuit wafer 84 to the supporting wafer 80, the invention can roughen (or recessed back by 20 to 50 nm to avoid physical contact during bonding) the portions of the integrated circuit wafer 84 facing the supporting wafer 80 in areas that will not be joined to the adjacent wafer to create rough surface portions 86 on the integrated circuit wafer 84. The roughening process can comprise chemical etching, reactive ion etching, depositing black silicon while the smooth areas are coated, etc.

This roughening process avoids producing rough surface portions 86 adjacent the joining points 88. A bonding surface should be optically smooth or mirror-like surface in order to have a good quality of bonding. Therefore, joining points 88 have an optically smooth surface.

Therefore, as shown in FIG. 8, the areas that will avoid bonding 86 can alternatively have an interface with some trapped nitrogen 20. Therefore, item 86 in the drawings alternatively represents an area that includes nitrogen in sufficient quantity to prevent wafer bonding (this area can also be roughened). The nitride regions 20, or nitrogen rich film 20, during the bonding process would produce an outgassing of nitrogen to prevent the two surfaces from bonding together.

During wafer bonding, as shown in FIGS. 8 and 9, the two wafers are contacted to each other in a reactor and heated to a to temperature range of 850 to 1200° C. in a suitable ambient. After bonding, only the joining points 88 defined by bonding agent 82 will be glued together.

Figure 10:
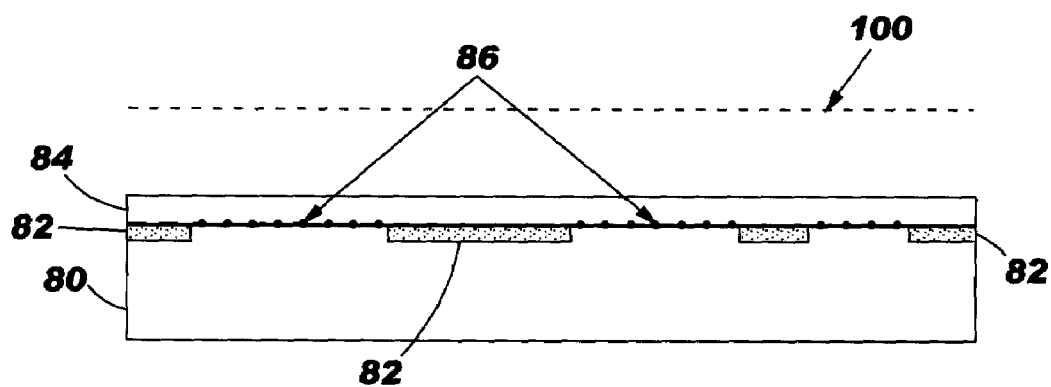
FIG. 10 is a schematic diagram of an integrated circuit wafer and supporting wafer according to the invention.
Figure 11:
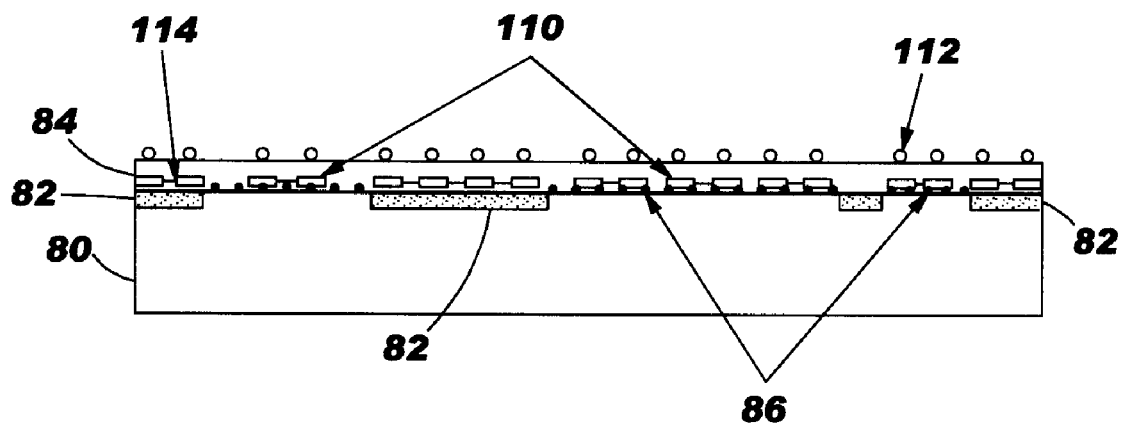
FIG. 11 is a schematic diagram of an integrated circuit wafer and supporting wafer according to the invention.

Once joined, the integrated circuit wafer 84 is chemically-mechanically polished to reduce the thickness of the integrated circuit wafer 84, as shown in FIG. 10 where the dashed line 100 shows the pre-polishing thickness. Then, after reducing the thickness of the integrated circuit wafer 84, the invention performs conventional processing on the integrated circuit wafer 84 to form devices 110 and wiring 114 in and on the integrated circuit wafer 84, as shown in FIG. 11. Once the devices and circuits 110 are formed, terminal metals are patterned and C4 solder ball connections 112 are formed, and the wafer is tested.

Figure 12:
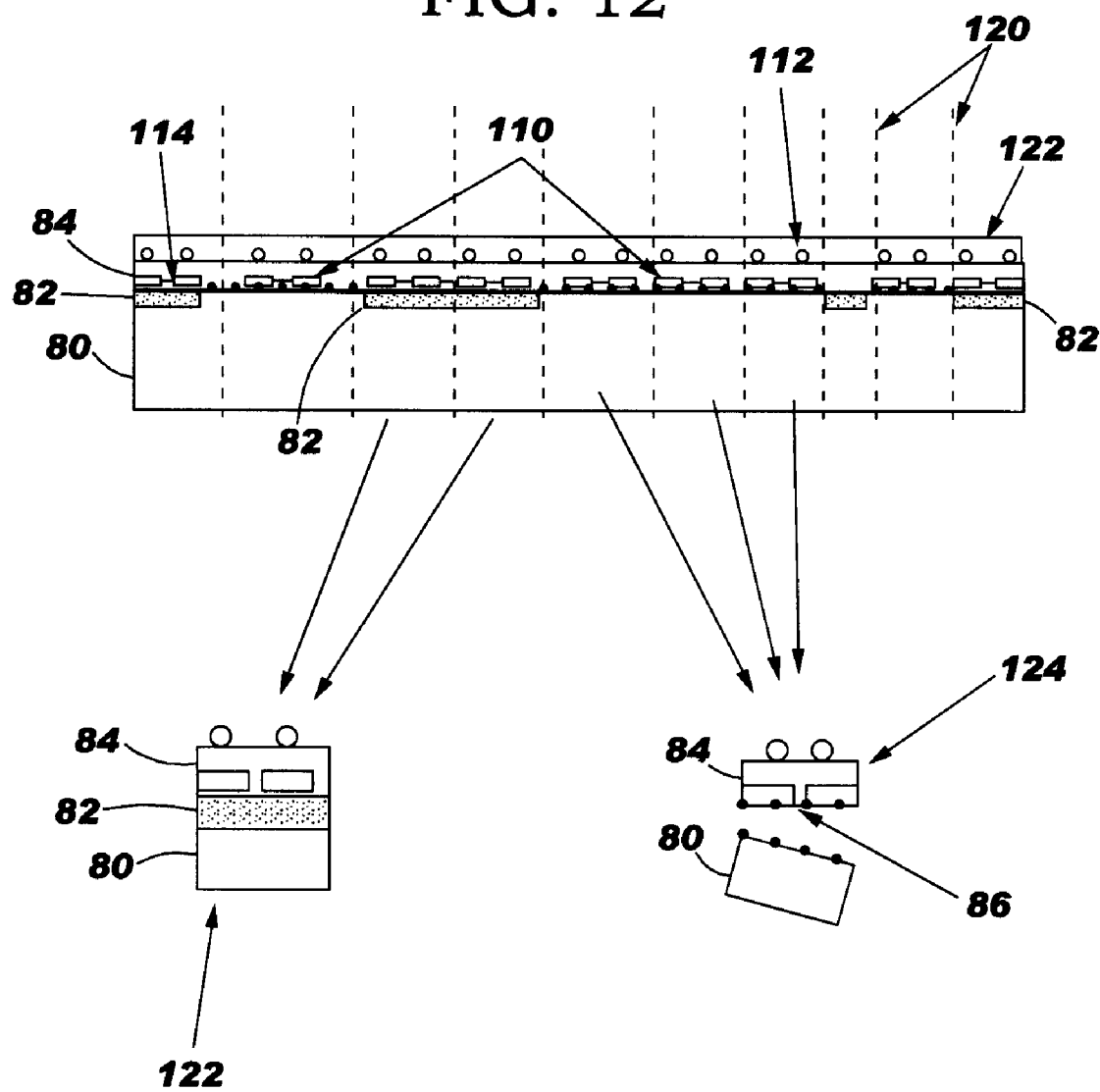
FIG. 12 is a schematic diagram of an integrated circuit wafer and supporting wafer according to the invention.

Next, as shown by the dashed vertical lines 120 in FIG. 12, the invention cuts through the integrated circuit wafer 84 and the supporting wafer 80 to form chip sections 122, 124. During this cutting process, the integrated circuit wafer 84 separates from the supporting wafer 80 in chip sections 124 where the integrated circuit wafer 84 is not joined to the supporting wafer 80 by the joining points 88 (e.g., where regions 86 prevents the wafers from joining). Chip sections 122 do not separate during the cutting process. Therefore, chip sections 122 where the wafer 84 remains joined to the supporting wafer 80 are thicker than the chips sections 124 where the integrated circuit wafer 84 separates from the supporting wafer 80.

In this dicing process shown in FIG. 12, both the top and bottom surfaces can be protected by adhesive films 126 to protect the dies, especially for very thin dies. These thin chips can be etched out by etching through the thin top silicon layer 84 and the thin dies can all be attached from the top layer since they are not bonded to the surface wafer 80.

Once the wafer is cut, both thin 124 and thick dies 122 are produced. The thick dies may be scrapped or used for other purposes such as test sites, end point sites, dummy fillers, etc. After dicing, the thin dices 124 have a very thin substrate thickness, but also due to its rough back surface 86, the thermal conductivity of the thin dies 124 is greatly improved.

Figure 13:
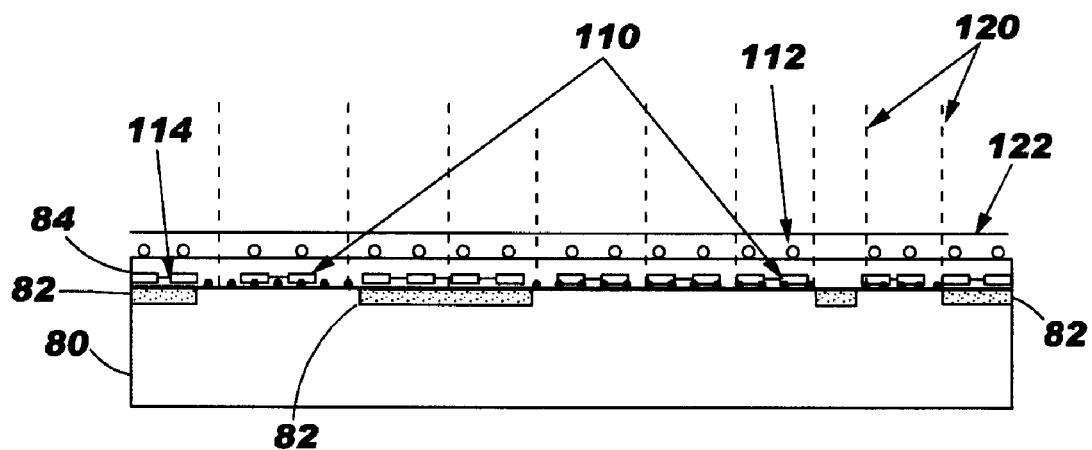
FIG. 13 is a schematic diagram of an integrated circuit wafer and supporting wafer according to the invention.
Figure 14:
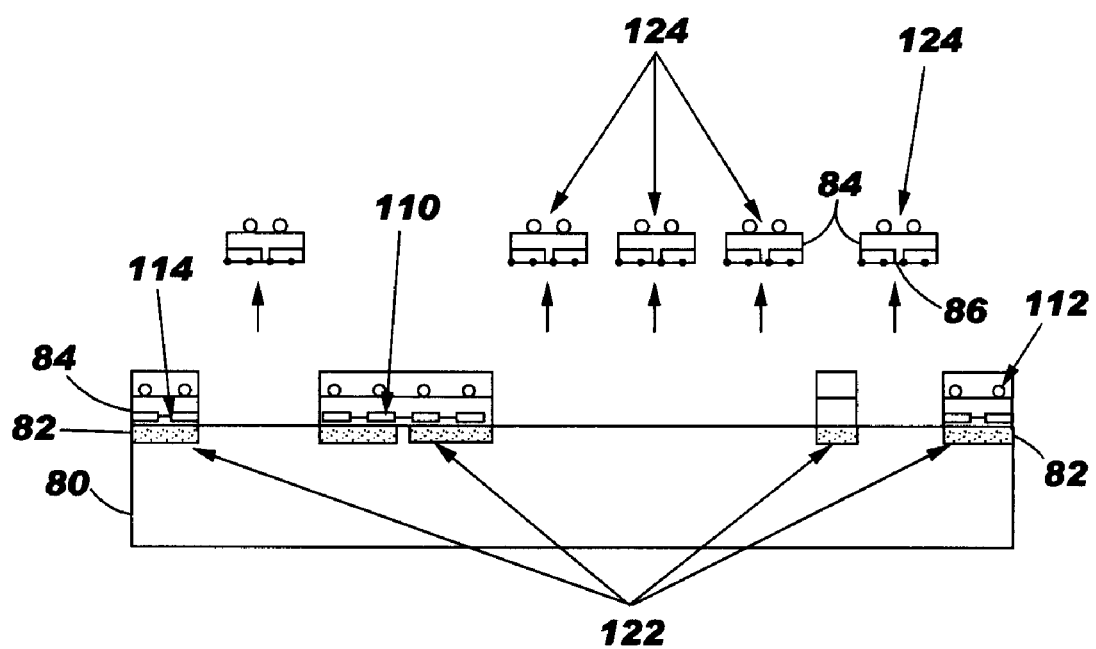
FIG. 14 is a schematic diagram of an integrated circuit wafer and supporting wafer according to the invention.

FIGS. 13 and 14 show partial dicing, where the chips are individually diced. In this process, the wafer is only cut to the level of the supporting wafer 80. This allows the integrated circuit sections 124 that are not jointed to the supporting wafer to release from the supporting wafer 80, while the other chip sections 122 remain attached to the supporting wafer 80. These thin chips 124 which are not bonded to the carrier wafer 80 can be etched out by etching through the thin top silicon layer 84 and the thin dies 124 can all be detached from the top.

The cutting can also be done by using laser, ion beam or other means. The thin coating 122 of, for example, an organic protective layer can be dissolved in a solvent after dicing. Dicing can be done by using laser cutting techniques especially on those thin dies. For testing purposes, one can pick one good thin die for laser cutting and send this selected die ahead for module mounting. This provides flexibility in manufacturing.

Figure 15:
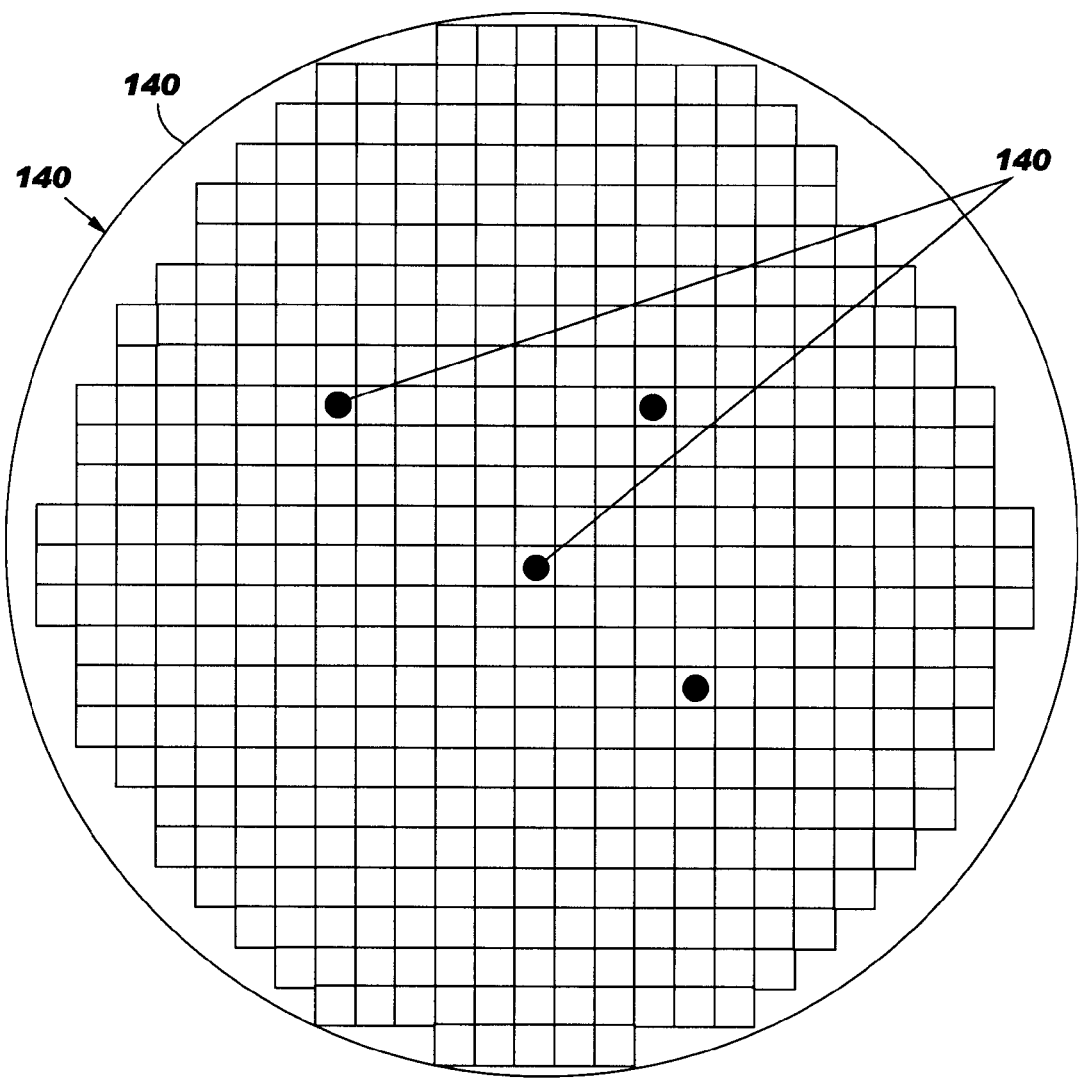
FIG. 15 is a schematic top-view diagram of an integrated circuit wafer and joining areas.

As shown in FIG. 15, the invention bonds only some limited predetermined areas so to allow better manufacturability. More specifically, FIG. 15 represents a top view of a wafer (e.g., 80) and the darkened areas 140 are the only areas of the wafer that will be bonded to the adjacent wafer (e.g., 84). As shown in this example, the boding area 140 is only on the edge of the wafer, and at selected areas 140 that do not require thinning (or that can be scrapped). The bonding pattern is designed based on the existing chip layout which will be patterned on the integrated circuit wafer 84. After boding, the wafer will have the proper thickness for handling and processing. The edges of the wafers are preferably bonded and sealed so that no chemical will get through the interface of two wafers and so that there is no possibility of detaching under the full course of chip processing environments. Thus, the bonded areas can be along the perimeter of wafer (e.g., a ring-shape 5 mm width bonding zone) and another 5 to 10 selected dies (uniformly distributed, taking yield loss after dicing).

Figure 16:
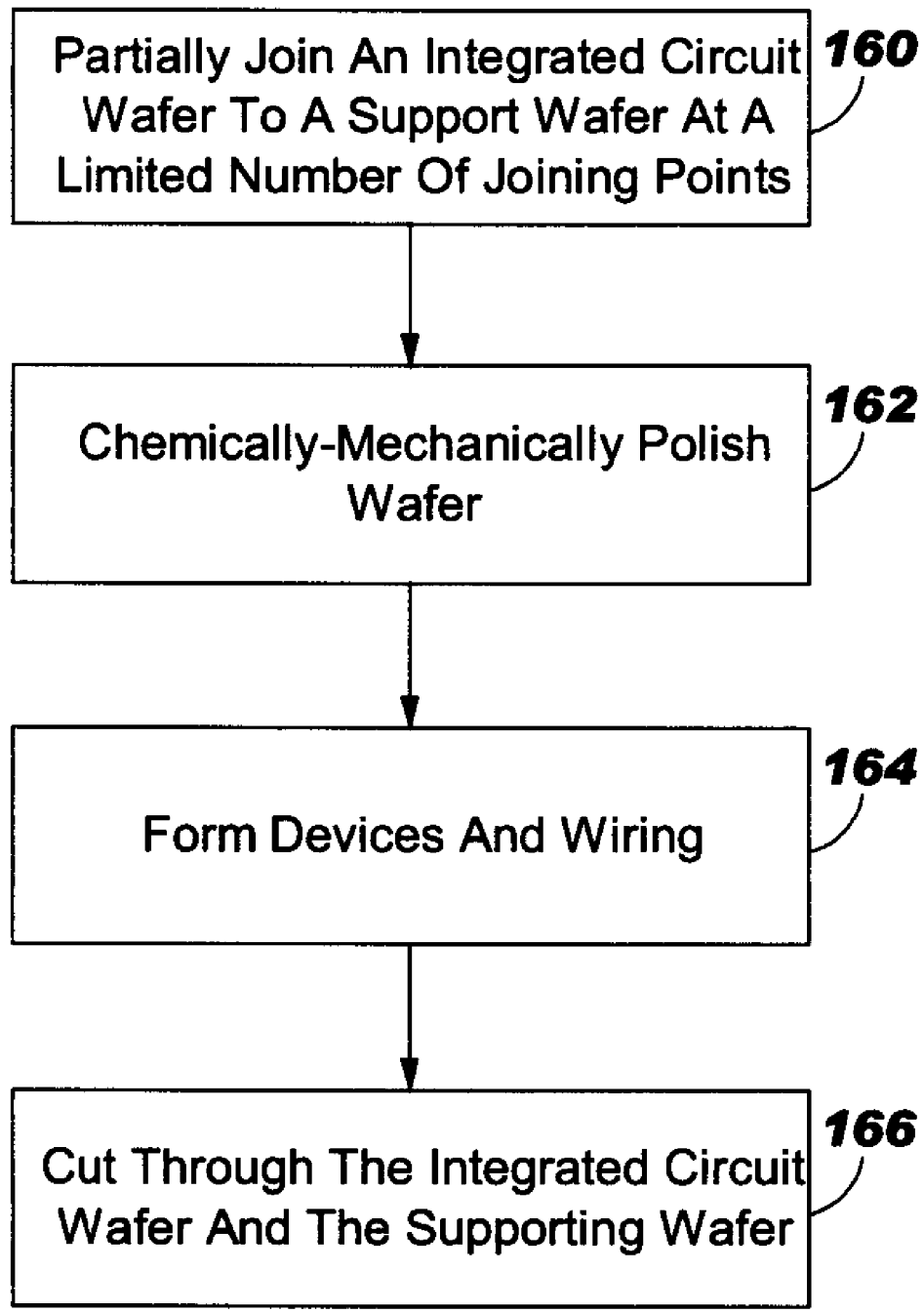
FIG. 16 is a flow diagram illustrating a preferred method of the invention.

FIG. 16 shows the processing of the invention in flow-chart form. More specifically, in item 160, the invention partially joins an integrated circuit wafer to a supporting wafer at a limited number of joining points. Once joined, the integrated circuit wafer is chemically-mechanically polished 162 to reduce the thickness of the integrated circuit wafer. Then, after reducing the thickness of the integrated circuit wafer, the invention performs conventional processing on the integrated circuit wafer to form devices and wiring 164 in the integrated circuit wafer. Next, the invention cuts through the integrated circuit wafer and the supporting wafer 166 to form chip sections. During this cutting process, the integrated circuit wafer separates from the supporting wafer in chip sections where the integrated circuit wafer is not joined to the supporting wafer by the joining points. Chip sections where the integrated circuit wafer remains joined to the supporting wafer are thicker than the chips sections where the integrated circuit wafer separates from the supporting wafer.

The invention presents a number of advantages when compared to conventional wafer thinning processes. First, because the supporting wafer 80 supports the integrated circuit wafer 84 during processing, the thickness of the integrated circuit wafer 84 can be reduced substantially when compared to conventional thin wafers. Further, because the invention thins the wafer before the devices, wiring, and interconnects 110 are formed, the invention increases yield by reducing any damage to such devices 110. Also, because the invention uses a high temperature bond 82, the invention maintains contact between the supporting wafer 80 and the integrated circuit wafer 84 during most of the high-temperature processing, again, increasing yield. Additionally, the invention can use a chemical-mechanical polishing process which allows substantial improvements in control of how much the thickness of the wafer can be reduced, especially when compared to conventional dry and wet etching processes.

While the invention has been described in terms of preferred embodiments, those skilled in the art will recognize that the invention can be practiced with modification within the spirit and scope of the appended claims.

The invention claimed is:

1. A method of manufacturing integrated circuit chips comprising:
   providing a supporting wafer comprising oxide regions in a substrate and having a planar surface at which said oxide regions and said substrate are exposed;
   partially joining an integrated circuit wafer to said planar surface of said supporting wafer at a limited number of joining points such that said oxide regions bond with said integrated circuit wafer to form said joining points and said substrate does not bond with but maintains contact with said integrated circuit wafer so as to support said integrated circuit wafer during subsequent processing and cutting;
   processing said integrated circuit wafer to form devices and wiring in said integrated circuit wafer; and
   cutting through said integrated circuit wafer to form chip sections,
   wherein, during said cutting process, said integrated circuit wafer separates from said supporting wafer in chip sections where said integrated circuit wafer is not joined to said supporting wafer by said joining points.

2. The method in claim 1, further comprising aligning said integrated circuit wafer to said supporting wafer before performing said joining process.

3. The method in claim 1, further comprising, before said joining process, roughening portions of said integrated circuit wafer facing said supporting wafer to create rough surface portions at the interface of said integrated circuit wafer, wherein said roughening process avoids producing rough surface portions adjacent said joining points.

4. The method in claim 1, wherein chip sections where said integrated circuit wafer remains joined to said supporting wafer are thicker than said chips sections where said integrated circuit wafer separates from said supporting wafer.

5. The method in claim 1, wherein said joining process comprises a bonding process.

6. The method in claim 1, wherein said joining process comprises a thermal oxide bonding process.

7. The method in claim 1, wherein said joining process creates said joining points to survive processing temperatures that are reached during said processing that forms said devices and said wiring in said integrated circuit wafer.

8. The method in claim 1, wherein said cutting process comprises cutting through said integrated circuit wafer without cutting through said support wafer.

9. The method in claim 8, wherein said cutting process comprises using a laser to cut through said integrated circuit wafer.

10. A method of manufacturing integrated circuit chips comprising:
    providing a supporting wafer comprising oxide regions in a substrate and having a planar surface at which said oxide regions and said substrate are exposed;
    partially joining an integrated circuit wafer to said planar surface of said supporting wafer at a limited number of joining points such that said oxide regions bond with said integrated circuit wafer to form said joining points and said substrate does not bond with but maintains contact with said integrated circuit wafer so as to support said integrated circuit wafer during subsequent reducing, processing and cutting;
    reducing the thickness of said integrated circuit wafer;
    processing said integrated circuit wafer to form devices and wiring in said integrated circuit wafer; and
    cutting through said integrated circuit wafer to form chip sections,
    wherein, during said cutting process, said integrated circuit wafer separates from said supporting wafer in chip sections where said integrated circuit wafer is not joined to said supporting wafer by said joining points.

11. The method in claim 10, further comprising aligning said integrated circuit wafer to said supporting wafer before performing said joining process.

12. The method in claim 10, further comprising, before said joining process, roughening portions of said integrated circuit wafer facing said supporting wafer to create rough surface portions at the interface of said integrated circuit wafer, wherein said roughening process avoids producing rough surface portions adjacent said joining points.

13. The method in claim 10, wherein chip sections where said integrated circuit wafer remains joined to said supporting wafer are thicker than said chips sections where said integrated circuit wafer separates from said supporting wafer.

14. The method in claim 10, wherein said joining process comprises a bonding process.

15. The method in claim 10,wherein said joining process comprises a thermal oxide bonding process.

16. The method in claim 10, wherein said joining process creates said joining points to survive processing temperatures tat are reached during said processing that forms said devices and said wiring in said integrated circuit wafer.

17. The method in claim 10, wherein said cutting process comprises cutting through said integrated circuit wafer without cutting through said support wafer.

18. The method in claim 17, wherein said cutting process further comprises using a laser to cut through said integrated circuit wafer without cutting through said support wafer.

19. The method in claim 18, wherein said cutting process comprises cutting through said integrated circuit wafer without cutting through said support wafer.

20. The method in claim 19, wherein said cutting process further comprises using a laser to cut through said integrated circuit wafer without cutting through said support wafer.

21. A method of manufacturing integrated circuit chips comprising:

providing a supporting wafer comprising oxide regions in a substrate and having a planar surface at which said oxide regions and said substrate are exposed;

partially joining an integrated circuit wafer to said planar surface of said supporting wafer at a limited number of joining points such that said oxide regions bond with said integrated circuit wafer to form said joining points and said substrate does not bond with but maintains contact with said integrated circuit wafer so as to support said integrated circuit wafer during subsequent polishing, processing and cutting;

chemically-mechanically polishing said integrated circuit wafer to reduce the thickness of said integrated circuit wafer;

processing said integrated circuit wafer to form devices and wiring in said integrated circuit wafer; and cutting through said integrated circuit wafer to form chip sections, wherein, during said cutting process, said integrated circuit wafer separates from said supporting wafer in chip sections where said integrated circuit wafer is not joined to said supporting wafer by said joining points.

22. The method in claim 21, further comprising aligning said integrated circuit wafer to said supporting wafer before performing said joining process.

23. The method in claim 21, further comprising, before said joining process, roughening portions of said integrated circuit wafer facing said supporting wafer to create rough surface portions at the interface of said integrated circuit wafer, wherein said roughening process avoids producing rough surface portions adjacent said joining points.

24. The method in claim 21, wherein chip sections where said integrated circuit wafer remains joined to said supporting wafer are thicker than said chips sections where said integrated circuit wafer separates from said supporting wafer.

25. The method in claim 21, wherein said joining process comprises a bonding process.

26. The method in claim 21, wherein said joining process comprises a thermal oxide bonding process.

* * * * *